(12) United States Patent
Kurita et al.

(10) Patent No.: US 11,453,053 B2
(45) Date of Patent: Sep. 27, 2022

(54) JOINING MATERIAL AND JOINING METHOD USING SAME

(71) Applicant: Dowa Electronics Materials Co., Ltd., Tokyo (JP)

(72) Inventors: Satoru Kurita, Tokyo (JP); Tatsuro Hori, Tokyo (JP); Keiichi Endoh, Tokyo (JP); Hiromasa Miyoshi, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 414 days.

(21) Appl. No.: 16/096,741

(22) PCT Filed: Apr. 25, 2017

(86) PCT No.: PCT/JP2017/016265
§ 371 (c)(1),
(2) Date: Oct. 26, 2018

(87) PCT Pub. No.: WO2017/188206
PCT Pub. Date: Nov. 2, 2017

(65) Prior Publication Data
US 2019/0118257 A1    Apr. 25, 2019

(30) Foreign Application Priority Data

Apr. 28, 2016  (JP) .............................. JP2016-091285
Apr. 18, 2017  (JP) .............................. JP2017-082296

(51) Int. Cl.
*B22F 1/107* (2022.01)
*B22F 1/102* (2022.01)
(Continued)

(52) U.S. Cl.
CPC .............. *B22F 1/107* (2022.01); *B22F 1/102* (2022.01); *B22F 7/064* (2013.01); *H01B 1/22* (2013.01);
(Continued)

(58) Field of Classification Search
CPC ........ B22F 1/00; B22F 1/0003; B22F 1/0007; B22F 1/0011; B22F 1/0014; B22F 1/0018; B22F 1/0022; B22F 1/0044; B22F 1/0048; B22F 1/0059; B22F 1/0062; B22F 1/0074; B22F 1/02; B22F 2301/255; B22F 2304/00; B22F 2304/05; B22F 2304/054; B22F 2304/056; B22F 2304/058; B22F 2304/10; B22F 1/052; B22F 1/10; B22F 1/102; B22F 1/103; B22F 1/107; B22F 1/16; H01L 24/05; H01L 24/06; H01L 24/08; H01L 24/09; H01L 24/29; H01L 24/30; H01L 24/32; H01L 24/33; H01L 24/37; H01L 24/38; H01L 24/40; H01L 24/41; H01L 24/45; H01L 24/46; H01L 24/48; H01L 24/49; H01L 24/66; H01L 24/67; H01L 24/69; H01L 24/70; H01L 2924/01047; H01L 2224/05139; H01L 2224/05239; H01L 2224/05339; H01L 2224/05439; H01L 2224/05639; H01L 2224/05739; H01L 2224/05839; H01L 2224/05939; H01L 2224/13139; H01L 2224/13239; H01L 2224/13339; H01L 2224/13439; H01L 2224/13639; H01L 2224/13739; H01L 2224/13839; H01L 2224/13939; H01L 2224/29139; H01L 2224/29239; H01L 2224/29339; H01L 2224/29439; H01L 2224/29639; H01L 2224/29739; H01L 2224/29839; H01L 2224/29939; H01L 2224/37139; H01L 2224/37239;
(Continued)

(56) References Cited

U.S. PATENT DOCUMENTS

2013/0001774 A1\*  1/2013  Masumori ............... H01L 24/32
                                                                257/737
2014/0000942 A1    1/2014  Seong et al.
(Continued)

FOREIGN PATENT DOCUMENTS

EP          3012048 A1   4/2016
JP        2005146181 A   6/2005
(Continued)

OTHER PUBLICATIONS

1-Octanol, Compound Summary, PubChem, date created Sep. 16, 2004, date modified Jan. 9, 2021, p. 1/64-64/64 (64 pages total ). (Year: 2021).\*
(Continued)

*Primary Examiner* — Vanessa T. Luk
(74) *Attorney, Agent, or Firm* — Bachman & LaPointe, P.C.

(57) ABSTRACT

There are provided a bonding material, which can prevent voids from being generated in a silver bonding layer by preventing the entrainment of bubbles during the formation of a coating film even if the coating film is thickened, and a bonding method using the same. The bonding material of a silver paste includes fine silver particles, a solvent and an addition agent, wherein the solvent contains a first solvent of a diol, such as octanediol, and a second solvent which is a polar solvent (preferably one or more selected from the group consisting of dibutyl diglycol, hexyl diglycol, decanol and dodecanol) having a lower surface tension than that of the first solvent and wherein the addition agent is a triol.

20 Claims, No Drawings

(51) Int. Cl.
*H01B 1/22* (2006.01)
*H01L 21/52* (2006.01)
*H01L 23/00* (2006.01)
*B22F 7/06* (2006.01)
*B82Y 30/00* (2011.01)
*B82Y 40/00* (2011.01)
*H01B 1/02* (2006.01)

(52) U.S. Cl.
CPC .............. *H01L 21/52* (2013.01); *H01L 24/26* (2013.01); *H01L 24/29* (2013.01); *H01L 24/83* (2013.01); *B22F 2301/255* (2013.01); *B82Y 30/00* (2013.01); *B82Y 40/00* (2013.01); *H01B 1/02* (2013.01); *H01L 24/32* (2013.01); *H01L 2224/29139* (2013.01); *H01L 2224/32245* (2013.01); *H01L 2224/8384* (2013.01); *H01L 2924/20106* (2013.01); *H01L 2924/20107* (2013.01); *H01L 2924/3656* (2013.01)

(58) Field of Classification Search
CPC . H01L 2224/37339; H01L 2224/37439; H01L 2224/37639; H01L 2224/37739; H01L 2224/37839; H01L 2224/37939; H01L 2224/45139; H01L 2224/45239; H01L 2224/45339; H01L 2224/45439; H01L 2224/45639; H01L 2224/45739; H01L 2224/45839; H01L 2224/45939; H01L 2224/48639; H01L 2224/48739; H01L 2224/48839; H01L 2224/80439; H01L 2224/80539; H01L 2224/80639; H01L 2224/80739; H01L 2224/81439; H01L 2224/81539; H01L 2224/81639; H01L 2224/81739; H01L 2224/83439; H01L 2224/83539; H01L 2224/83639; H01L 2224/83739; H01L 2224/84439; H01L 2224/84539; H01L 2224/84639; H01L 2224/84739; H01L 2224/85439; H01L 2224/85539; H01L 2224/85639; H01L 2224/85739; B23K 35/0244; B23K 35/025; B23K 35/3006
See application file for complete search history.

(56) References Cited

U.S. PATENT DOCUMENTS

| | | | |
|---|---|---|---|
| 2015/0028085 A1* | 1/2015 | Endoh | B22F 1/0062 228/224 |
| 2016/0136763 A1* | 5/2016 | Endoh | B22F 1/0014 228/248.1 |

FOREIGN PATENT DOCUMENTS

| | | | |
|---|---|---|---|
| JP | 2011080147 | A | 4/2011 |
| JP | 2013069475 | A | 4/2013 |
| JP | 2016008332 | A | 1/2016 |
| WO | 2014204013 | A1 | 12/2014 |
| WO | 2013108408 | A1 | 5/2015 |
| WO | 2015198832 | A1 | 12/2015 |

OTHER PUBLICATIONS

International search report for application No. PCT/JP2017/016265 dated Jun. 30, 2017.
European search report for patent application No. 17789488.8-1103 dated Nov. 21, 2019.

* cited by examiner

JOINING MATERIAL AND JOINING METHOD USING SAME

TECHNICAL FIELD

The present invention relates generally to a bonding material and a bonding method using the same. More specifically, the invention relates to a bonding material of a silver paste containing fine silver particles, and a method for bonding an electronic part, such as an Si chip, on a metal substrate, such as a copper substrate, using the bonding material.

BACKGROUND ART

In recent years, it is proposed that a silver paste containing fine silver particles is used as a bonding material to be arranged between articles to be heated to sinter silver in the bonding material to bond the articles to each other (see, e.g., Patent Documents 1-2).

When such a bonding material is used for fixing an electronic part, such as an Si chip, on a metal substrate, such as a copper substrate, a silver paste containing fine silver particles dispersed in a solvent is applied on the substrate to be heated to remove the solvent to form a pre-dried film on the substrate to arrange the electronic part thereon, and then, the pre-dried film is heated while applying pressure on the electronic part, so that it is possible to bond the electronic part to the substrate via a silver bonding layer.

PRIOR ART DOCUMENT(S)

Patent Document(s)

Patent Document 1: Japanese Patent Laid-Open No. 2011-80147 (Paragraph Numbers 0014-0020)
Patent Document 2: Japanese Patent Laid-Open No. 2016-8332 (Paragraph Numbers 0009-0012)

SUMMARY OF THE INVENTION

Problem to be Solved by the Invention

However, if a conventional bonding material of a silver paste containing fine silver particles, such as the bonding materials of Patent Documents 1-2, is printed on a substrate by means of a metal mask and a metal squeegee so as to have a thickness of 150 μm or more to form a thick coating film, the entrainment of bubbles (the entrainment of gasses, such as air, for obstructing a uniform state) is caused by the rotation (rolling) of the silver paste between the metal mask and the metal squeegee during printing, so that bubbles are easily involved in the coating film. The bubbles formed in the coating film easily cause the formation of surface roughness of a pre-dried film, the formation of cracks in the pre-dried film, and/or the separation of the pre-dried film. The surface roughness of the pre-dried film, the cracks in the pre-dried film and so forth easily cause the formation of voids in a silver bonding layer, and easily cause the deterioration of reliability and/or heat radiation performance of the bonding material. In particular, when an SiC device required to have reliability at high temperatures is bonded to a substrate, there are some cases where it is required to sufficiently increase the thickness of the bonding layer in order to ensure reliability at high temperatures. If the coating film is thickened to increase the thickness of the pre-dried film in order to increase the thickness of the bonding layer, the shrinkage of the pre-dried film is increased to more easily cause the formation of surface roughness of the pre-dried film, the formation of cracks in the pre-dried film, and/or the separation of the pre-dried film.

It is therefore an object of the present invention to eliminate the aforementioned conventional problems and to provide a bonding material, which can prevent voids from being generated in a silver bonding layer by preventing the entrainment of bubbles during the formation of a coating film even if the coating film is thickened, and a bonding method using the same.

Means for Solving the Problem

In order to accomplish the aforementioned object, the inventors have diligently studied and found that it is possible to provide a bonding material, which can prevent voids from being generated in a silver bonding layer by preventing the entrainment of bubbles during the formation of a coating film even if the coating film is thickened, and a bonding method using the same, if the bonding material of a silver paste includes fine silver particles, a solvent and an addition agent, wherein the solvent contains a first solvent of a diol and a second solvent which is a polar solvent having a lower surface tension than that of the first solvent and wherein the addition agent is triol. Thus, the inventors have made the present invention.

According to the present invention, there is provided a bonding material of a silver paste comprising: fine silver particles; a solvent containing a first solvent of a diol and a second solvent which is a polar solvent having a lower surface tension than that of the first solvent; and an addition agent which is a triol.

In this bonding material, the first solvent is preferably octanediol. The second solvent is preferably one or more selected from the group consisting of dialkyl glycol ethers, ethylene glycol ethers and mono-alcohols, and more preferably one or more selected from the group consisting of dibutyl diglycol, hexyl diglycol and decanol. The fine silver particles preferably have an average primary particle diameter of 1 to 100 nm. The content of the fine silver particles in the bonding material is preferably in the range of from 60% by weight to 90% by weight. The bonding material may contain silver particles having an average particle diameter of 0.2 to 10 μm. In this case, the content of the silver particles having the average particle diameter of 0.2 to 10 μm in the bonding material is preferably 30% by weight or less, and the total of the content of the fine silver particles and the content of the silver particles having the average particle diameter of 0.2 to 10 μm is preferably in the range of from 60% by weight to 90% by weight. Each of the fine silver particles is preferably coated with an organic compound having a carbon number of not greater than 8. The organic compound is preferably sorbic acid. The content of the first solvent in the bonding material is preferably in the range of from 5% by weight to 20% by weight. The content of the second solvent in the bonding material is preferably in the range of from 0.5% by weight to 15% by weight. The content of the addition agent in the bonding material is preferably in the range of from 0.5% by weight to 10% by weight. The bonding material may contain a sintering aid. In this case, the sintering aid is preferably diglycolic acid or malonic acid, and the content of the sintering aid in the bonding material is preferably in the range of from 0.001% by weight to 0.1% by weight.

According to the present invention, there is provided a bonding method comprising the steps of: arranging the above-described bonding material between articles; and heating the bonding material to sinter silver therein to form a silver bonding layer to bond the articles to each other with the silver bonding layer.

Throughout the specification, the expression "the average primary particle diameter of fine silver particles" means an average value of primary particle diameters of fine silver particles obtained on the basis of a scanning electron microscope (SEM) or a transmission electron microphotograph (TEM image).

Effects of the Invention

According to the present invention, it is possible to provide a bonding material, which can prevent voids from being generated in a silver bonding layer by preventing the entrainment of bubbles during the formation of a coating film even if the coating film is thickened, and a bonding method using the same.

MODE FOR CARRYING OUT THE INVENTION

The preferred embodiment of a bonding material according to the present invention is formed of a silver paste containing: fine silver particles; a solvent containing a first solvent of a diol and a second solvent which is a polar solvent having a lower surface tension than that of the first solvent; and an addition agent which is a triol. Thus, if the second solvent, which is a polar solvent having a lower surface tension than that of the first solvent, is added as a defoaming agent to lower the surface tension of the solvent while adding the triol, it is possible to prevent voids from being generated in a silver bonding layer by preventing the entrainment of bubbles during the formation of a coating film even if the coating film is thickened.

In the preferred embodiment of a bonding method according to the present invention, the above-described bonding material is arranged between articles to be heated to sinter silver therein to form a silver bonding layer to bond the articles to each other with the silver bonding layer. For example, the above-described bonding material is applied on a copper substrate to obtain a coating film. The coating film thus obtained is pre-dried to obtain a pre-dried film. On the bonding material of the pre-dried film thus obtained, an electronic part is arranged. Then, the bonding material of the pre-dried film is heated while applying pressure on the electronic part. Thus, silver in the silver paste is sintered to form a silver bonding layer to bond the electronic part to the copper substrate with the silver bonding layer. If the above-described bonding material is used, when a thick coating film having a thickness of about 200 μm is formed on a substrate, it is possible to prevent the entrainment of bubbles, and it is possible to prevent the formation of cracks in the pre-dried film and/or the separation of the pre-dried film. In addition, even if it is heated while applying a low pressure of about 5 MPa, it is possible to prevent voids from being generated in a silver bonding layer. Thus, it is possible to bond the articles to each other at a high bonding strength.

In the above-described preferred embodiment of the bonding material, the first solvent is a diol (having two hydroxyl groups), and is preferably a solvent which does not remain in a silver bonding layer due to evaporation or decomposition when the bonding material is heated to sinter silver in the silver paste to form the silver bonding layer. The boiling point of the first solvent is preferably 200 to 300° C. (more preferably 210 to 290° C.) so that the fine silver particles in the bonding material can be heated at a low temperature of 200 to 300° C. (preferably 210 to 290° C.) to sinter silver to form the silver bonding layer. The surface tension of the first solvent is preferably 31.4 to 37.4 dyne/cm on average. For example, the surface tension can be measured by means of a full automatic surface tensiometer (CBVP-Z produced by Kyowa Interface Science Co., Ltd.) or the like. The viscosity of the first solvent is preferably 1 to 300 mPa·s (more preferably 50 to 200 mPa·s) at 25° C. so that a thick coating film having a thickness of not less than 150 μm can be formed by a silver paste which is formed by adding the first solvent, together with the second solvent and the addition agent, to the fine silver particles. As such a first solvent, a diol having a carbon number of 3 to 10 is preferably used, and a diol having a carbon number of 3 to 8 is more preferably used. Such a first solvent is preferably a diol having a branch.

Specifically, as such a first solvent, there is preferably used octanediol (ODO) (2-ethyl-1,3-hexanediol, boiling point=243.0±8.0° C., viscosity (25° C.)=178 mPa·s, surface tension (25° C.)=34.4±3.0 dyne/cm (average value=34.4 dyne/cm)). Furthermore, as the first solvent, a kind of diol may be used, and two or more kinds of diols may be used. The content of the first solvent in the bonding material is preferably 5 to 20% by weight and more preferably 7 to 18% by weight.

The second solvent is a polar solvent having a lower surface tension than that of the first solvent. If such a polar solvent having a lower surface tension than that of the first is added, the surface tension of the total solvent can be lowered. Therefore, in comparison with the case where only the first solvent is used, it is possible to prevent voids from being generated in a silver bonding layer by preventing the entrainment of bubbles during the formation of a coating film even if the coating film is thickened. The polar solvent, which can be used as the second solvent, preferably has a polarity to such a degree that it is compatible with the first solvent. As the second solvent, there can be used a polar solvent having hydroxyl group(s), ether bond(s), amino group(s) and/or carboxyl group(s), and there is preferably used a polar solvent having hydroxyl group(s) and/or ether bond(s). Furthermore, when the second solvent is a polar solvent having hydroxyl group(s), there is preferably used a polar solvent (having one hydroxyl group or at least four hydroxyl groups) other than diol and triol.

Similar to the first solvent, the second solvent is preferably a solvent which does not remain in a silver bonding layer due to evaporation or decomposition when the bonding material is heated to sinter silver in the silver paste to form the silver bonding layer. The boiling point of the second solvent is preferably 200 to 300° C. so that the fine silver particles in the bonding material can be heated at a low temperature of 200 to 300° C. to sinter silver to form the silver bonding layer. The average surface tension of the second solvent is preferably lower than that of the first solvent by 2.0 dyne/cm. The viscosity of the second solvent is preferably 1 to 200 mPa·s (more preferably 1 to 100 mPa·s) at 25° C. so that a thick coating film having a thickness of not less than 150 μm can be formed by a silver paste which is formed by adding the second solvent, together with the first solvent and the addition agent, to the fine silver particles. As such a second solvent, there is preferably used a glycol ether, such as a dialkyl glycol ether or an ethylene glycol ether, or a mono-alcohol. There is more preferably used a glycol ether or mono-alcohol having a carbon number of 8 to 12.

Specifically, as such a second solvent, there may be used dibutyl diglycol (DBDG) (boiling point=254.6° C., viscosity (25° C.)=2.4 mPa·s, surface tension (25° C.)=28.7±3.0 dyne/cm (average value=28.7 dyne/cm)), hexyl diglycol (HeDG) (boiling point=260° C., viscosity (25° C.)=8.6 mPa·s, surface tension (25° C.)=32.3±3.0 dyne/cm (average value=32.3 dyne/cm)), 1-decanol (boiling point=227.8±3.0° C., viscosity (25° C.)=1.38 mPa·s, surface tension (25° C.)=29.9±3.0 dyne/cm (average value=29.9 dyne/cm)), 1-dodecanol (boiling point=258° C., viscosity (25° C.)=18 to 20 mPa·s, surface tension (25° C.)=30.4±3.0 dyne/cm (average value=30.4 dyne/cm)) or the like, and there is preferably used dibutyl diglycol (DBDG), hexyl diglycol (HeDG) or 1-decanol. Furthermore, as the second solvent, there may be used a kind of polar solvent having a lower surface tension than that of the first solvent, or two or more kinds of the polar solvents. The content of the second solvent in the bonding material is preferably 0.5 to 15% by weight and more preferably 0.7 to 12% by weight.

The triol used as the addition agent has three hydroxyl groups to have a good dispersability with the first and second solvents, so that it is possible to prevent voids from being generated in a silver bonding layer by preventing the entrainment of bubbles during the formation of a coating film even if the coating film is thickened by a silver paste which is formed by adding the triol, together with the first and second solvents, to the fine silver particles.

Similar to the first and second solvents, the triol used as the addition agent is preferably a triol which does not remain in a silver bonding layer due to evaporation or decomposition when the bonding material is heated to sinter silver in the silver paste to form the silver bonding layer. The boiling point of the triol used as the addition agent is preferably 200 to 300° C. so that the fine silver particles in the bonding material can be heated at a low temperature of 200 to 300° C. to sinter silver to form the silver bonding layer. The surface tension of the triol used as the addition agent is preferably 30 to 50 dyne/cm (more preferably 30 to 40 dyne/cm) on average so as not to increase the surface tension of the solvent. The viscosity of the triol used as the addition agent is preferably 2000 to 10000 mPa·s (more preferably 4000 to 10000 mPa·s) at 25° C. so that a thick coating film having a thickness of not less than 150 μm can be formed by a silver paste which is formed by adding the triol, together with the first solvent and the second solvent, to the fine silver particles. As such a triol, there is preferably used a triol having a carbon number of 3 to 8, and there is more preferably a triol having a carbon number of 3 to 6. Such a triol preferably has a branch in order to improve the compatibility with the first solvent. Furthermore, the branch may be formed by a hydrocarbon group or a hydroxyl group.

Specifically, as such a triol, there may be used 2-methyl-butane-2,3,4-triol (isoprene triol A (IPTL-A)) (boiling point=255.5° C., viscosity (25° C.)=5420 mPa·s, surface tension (25° C.)=38.7 dyne/cm), 2-methyl-butane-1,3,4-triol (isoprene triol B (IPTL-B)) (boiling point=278 to 282° C., viscosity (25° C.)=4050 mPa·s, surface tension (25° C.)=47.5±1.0 dyne/cm (average value=47.5 dyne/cm)) or the like, and there is preferably used 2-methyl-butane-2,3,4-triol (isoprene triol A (IPTL-A)). Furthermore, as the addition agent, a kind of triol may be used, and two or more kinds of triols may be used. The content of the triol used as the addition agent in the bonding material is preferably 0.5 to 10% by weight and more preferably 1 to 7% by weight.

The bonding material may contain a sintering aid. This sintering aid is preferably a dicarboxylic acid, and more preferably diglycolic acid or malonic acid having a carbon number of 2 to 6. The content of the sintering aid in the bonding material is preferably in the range of from 0.001% by weight to 0.1% by weight, and more preferably in the range of from 0.005% by weight to 0.05% by weight.

The average primary particle diameter of the fine silver particles is preferably in the range of from 1 nm to 100 nm (more preferably in the range of from 40 nm to 100 nm) so that the fine silver particles in the bonding material can be heated at a low temperature of 200 to 300° C. to sinter silver to form a silver bonding layer. The content of the fine silver particles in the bonding material is preferably in the range of from 60% by weight to 90% by weight, and more preferably in the range of from 75% by weight to 90% by weight.

The bonding material may contain silver particles having an average particle diameter of 0.2 to 10 μm (preferably 0.3 to 1 μm). If the fine silver particles in the bonding material are heated at a low temperature of 200 to 300° C. to sinter silver, such micron-sized silver particles are connected to each other by the fusion-bonded fine silver particles, so that it is possible to totally form the silver bonding layer. In this case, the content of the silver particles having the average particle diameter of 0.2 to 10 μm in the bonding material is preferably 30% by weight or less, and the total of the content of the fine silver particles and the content of the silver particles having the average particle diameter of 0.2 to 10 μm is preferably in the range of from 60% by weight to 90% by weight.

Each of the fine silver particles is preferably coated with an organic compound having a carbon number of not greater than 8 (e.g., a fatty acid or amine having a carbon number of not greater than 8) in order to prevent the fine silver particles from aggregating in the bonding material. As such an organic compound, there may be used sorbic acid or hexanoic acid, and there is preferably used sorbic acid so that the organic compound has a good dispersability with the first and second solvents.

Furthermore, the average primary particle diameter of the fine silver particles can be calculated, for example, from the average primary particle diameter of optionally selected 100 or more of fine silver particles on an image (SEM image or TEM image) obtained by observing the fine silver particles by means of a scanning electron microscope (SEM) (S-4700 produced by Hitachi Hi-Technologies Corporation) or a transmission electron microscope (TEM) (JEM-1011 produced by Japan Electron Optics Laboratory Ltd.) at a predetermined magnification (for example, a magnification of 180,000 by TEM when the particle diameter is not greater than 20 nm, a magnification of 80,000 by SEM when the particle diameter is greater than 20 nm and not greater than 30 nm, and a magnification of 50,000 by SEM when the particle diameter is greater than 30 nm and not greater than 100 nm). The calculation of the average primary particle diameter of the fine silver particles can be carried out, for example, by an image analysis software (A-image-kun (registered trademark) produced by Asahi Kasei Engineering Corporation).

The viscosity of the bonding material measured at 25° C. and 5 rpm is preferably 10 to 30 Pa·s, and more preferably 10 to 20 Pa·s. The ratio (Ti value) of the viscosity of the bonding material at 1 rpm (3.1 [1/s]) to the viscosity thereof at 5 rpm (viscosity at 1 rpm/viscosity at 5 rpm) is preferably 3.0 to 5.0 when the viscosity thereof was measured at 25° C.

EXAMPLES

Examples of a bonding material and a bonding method using the same according to the present invention will be described below in detail.

Example 1

First, 180.0 g of pure water was put in a 300 mL beaker, and 33.6 g of silver nitrate (produced by Toyo Kagaku Inc.) was added thereto to be dissolved to prepare an aqueous silver nitrate solution as a raw material solution.

Then, 3322.0 g of pure water was put in a 5 L beaker, and the temperature thereof was raised to 40° C. while removing dissolved oxygen by blowing nitrogen gas into the pure water for 30 minutes. To this pure water, 44.8 g of sorbic acid (produced by Wako Pure Chemical Industries, Ltd.) was added as an organic compound (for coating of fine silver particles), and thereafter, 7.1 g of 28% ammonia water (produced by Wako Pure Chemical Industries, Ltd.) was added thereto as a stabilizing agent.

While the aqueous solution was stirred after the ammonia water was added, 14.91 g of hydrous hydrazine having a purity of 80% (produced by Otsuka Chemical Co., Ltd.) was added thereto as a reducing agent after 5 minutes from the addition of the ammonia water (reaction initiation), to prepare an aqueous reducing agent containing solution as a reducing solution. After 9 minutes from the reaction initiation, the raw material solution (aqueous silver nitrate solution), the temperature of which was adjusted to 40° C., was added to the reducing solution (aqueous reducing agent containing solution) at a stroke to be allowed to react with the reducing solution, and stirred for 80 minutes. Thereafter, the temperature of the solution was raised at a temperature raising rate of 1° C./min from 40° C. to 60° C., and the stirring was stopped.

After the aggregates of the fine silver particles (silver nanoparticles) coated with sorbic acid were thus formed, a liquid containing the aggregates of the fine silver particles was filtered by a No. 5C filter paper, and then, a recovery obtained by filtration was washed with pure water to obtain the aggregates of the fine silver particles. The aggregates of the fine silver particles were dried at 80° C. for 12 hours in a vacuum dryer to obtain a dried powder of the aggregates of the fine silver particles. The dried powder of the aggregates of the fine silver particles thus obtained was broken to adjust the size of the secondary aggregates. Furthermore, the average primary particle diameter of the fine silver particles was obtained by means of a scanning electron microscope (SEM). As a result, the average primary particle diameter was 85 nm.

Then, there were mixed 86.0 g of the dried powder of the aggregates of the fine silver particles (silver particles 1) (coated with sorbic acid), the size of the secondary aggregates of which was thus adjusted, 9.89 g of octanediol (ODO) (2-ethyl-1,3-hexanediol produced by HK Neochem Co., Ltd., boiling point=243.0±8.0° C., viscosity (25° C.)=178 mPa·s, surface tension (25° C.)=34.4±3.0 dyne/cm (average value=34.4 dyne/cm)) serving as a first solvent (solvent 1), 1.10 g of dibutyl diglycol (DBDG) (produced by Nippon Nyukazai Co., Ltd., boiling point=254.6° C., viscosity (25° C.)=2.4 mPa·s, surface tension (25° C.)=28.7±3.0 dyne/cm (average value=28.7 dyne/cm)) serving as a second solvent (solvent 2), 3.0 g of 2-methyl-butane-2,3,4-triol (isoprene triol A (IPTL-A)) (produced by Nippon Terpene Chemicals, Inc., boiling point=255.5° C., viscosity (25° C.)=5420 mPa·s, surface tension (25° C.)=38.7 dyne/cm) serving as an addition agent, and 0.01 g of diglycolic acid (DGA) (produced by Midori Kagaku Co., Ltd.) serving as a sintering aid (sintering-inducing agent). The mixture thus obtained was kneaded at a revolution speed of 1400 rpm and a rotation speed of 700 rpm for 30 seconds by means of a kneading/degassing machine (V-mini 300 produced by EME Co., Ltd.). The mixture thus kneaded was diluted with a mixed solvent (SOLMIX AP-7 produced by Japan Alcohol Treading Co., Ltd.) to be stirred. Then, the mixture was broken by a wet jet mill (RM-L1000EP produced by RIX Corporation), and then, vacuum-degassed by means of a vacuum degassing mixer to evaporate all of the mixed solvent (SOLMIX AP-7). Then, 5.80 g of octanediol (ODO) and 0.64 g of dibutyl diglycol (DBDG) serving as diluting solvents were added thereto to obtain a bonding material of a silver paste containing 80.8% by weight of silver particles, 14.73% by weight of ODO, 1.64% by weight of DBDG, 2.82% by weight of IPTL-A and 0.01% by weight of DGA.

The viscosity of this bonding material was obtained by a rheometer (viscoelasticity measuring apparatus) (HAAKE Rheostress 600 produced by Thermo Scientific, Inc., used cone: C35/2°). As a result, the viscosity measured at 25° C. was 15 (Pa·s) at 5 rpm (15.7 [1/s]), and the ratio (Ti value) of the viscosity at 1 rpm (3.1 [1/s]) to the viscosity at 5 rpm (viscosity at 1 rpm/viscosity at 5 rpm) was 3.6 when the viscosity was measured at 25° C. The viscosity was measured after 20 seconds from when the shear velocity was varied to reach each of 1.6 [1/s], 3.1 [1/s], 6.3 [1/s], 15.7 [1/s], 31.3 [1/s], 62.7 [1/s] and 156.7 [1/s], respectively. Furthermore, the content of Ag in the silver paste was obtained by the heating loss method. As a result, the content of Ag was 79.6% by weight.

The particle size of silver particles contained in the bonding material (silver paste) was evaluated by a grind gage (produced by BYK Limited, 50 μm stainless steel) as follows. First, the grind gage was cleaned with an alcohol solvent (SOLMIX), and sufficiently dried. Then, about 5 to 10 g of the silver paste was put on the side of a deeper groove of the grind gage (on the side of 50 μm), and a scraper was picked up by the thumb and another finger of both hands to be arranged so that the long sides of the scraper were parallel to the width directions of the grind gage while causing the blade edge of the scraper to contact the deep tip portion of the groove of the grind gage. Then, while the scraper was held so as to be perpendicular to the surface of the grind gage, the grind gage was drawn at a uniform velocity to a portion having a depth of zero in one or two seconds in a direction perpendicular to the long sides of the groove. Within 3 seconds after the drawing of the grind gage was completed, light was emitted so as to cause the pattern of the silver paste to be easily visible, and a portion, at which a remarkable line started to appear in the silver paste, was observed from a direction which was perpendicular to the long sides of the groove and which had an angle of 20 to 30° with respect to the surface of the grind gage. Thus, there were obtained the particle size of a line (the first scratch, maximum particle diameter $D_{max}$) being the first to appear along the groove, the particle size of a line (the fourth scratch) being the fourth to appear along the groove, and the average particle diameter $D_{50}$ as the particle size of uniformly appearing 10 or more of lines. Furthermore, there were ignored lines sparsely appearing before the remarkable line started to appear. Since there was one grind gage on each of right and left sides thereof, the average value of the values indicated by the two lines was obtained as the measured result. As a result, the first scratch was less than 20 μm, the fourth scratch was less than 10 μm, and the average particle diameter $D_{50}$ was less than 5 μm.

Then, a metal mask having a thickness of 200 μm was arranged on a substrate of copper (C1020) having a size of 30 mm×30 mm×1 mm, and the above-described bonding material (silver paste) was applied on the copper substrate so as to have a size of 10 mm×10 mm and a thickness (printing thickness) of 200 μm with a metal squeegee by means of a screen printing machine (SP18P-L produced by Panasonic Factory Solutions Sales & Engineering Japan Co., Ltd.). The coating film thus obtained was observed by a three-dimensional shape measuring device (Microscope VR-3200 produced by KEYENCE CORPORATION). As a result, no bubbles were observed in the coating film.

Thereafter, the copper substrate having the bonding material applied thereon was put on a metal tray to be arranged in an oven (produced by Yamato Scientific Co., Ltd.) to be heated at 120° C. for 20 minutes in the atmosphere to be pre-dried to remove solvents in the bonding material to form a pre-dried film. The pre-dried film was observed by a three-dimensional shape measuring device (Microscope VR-3200 produced by KEYENCE CORPORATION). As a result, no cracks were observed in the pre-dried film.

After the copper substrate having the pre-dried film formed thereon was cooled to 25° C., an SiC chip (having a size of 8 mm×8 mm) plated with silver so as to form a silver plating film having a thickness of 0.3 mm was arranged on the pre-dried film. Then, the substrate was arranged on a heat press machine (produced by DOWA ELECTRONICS MATERIALS CO., LTD.) to raise the temperature thereof to 290° C. in about 120 seconds while applying a load of 5.0 MPa in the atmosphere. After the temperature thereof reached to 290° C., the substrate was held for 90 seconds to burn the pre-dried film to sinter silver in the silver paste to form a silver bonding layer to bond the SiC chip to the copper substrate with the silver bonding layer to obtain a bonded product.

With respect to the bonded product thus obtained, the presence of voids in the silver bonding layer was observed by means of an ultrasonic microscope (C-SAM produced by SONOSCAN, INC.). As a result, no voids were observed.

Example 2

A bonding material (silver paste) containing 79.5% by weight of silver particles 1, 15.06% by weight of ODO, 2.66% by weight of DBDG, 2.77% by weight of IPTL-A and 0.01% by weight of DGA was obtained by the same method as that in Example 1, except that the amount of ODO added as the solvent 1 was 9.34 g, that the amount of DBDG added as the solvent 2 was 1.65 g and that the amounts of ODO and DBDG added as the diluting solvents were 6.91 g and 1.22 g, respectively. Furthermore, the content of Ag in the silver paste was obtained by the heating loss method. As a result, the content of Ag was 78.5% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.7 when the viscosity was measured at 25° C.

The bonding material was used for preparing a coating film, a pre-dried film and a bonded product to observe them by the same methods as those in Example 1. As a result, no bubbles were cracks were observed in the pre-dried film, and the separation of the pre-dried film was not observed. Moreover, no voids were observed in the silver bonding layer of the bonded product.

Example 3

A bonding material (silver paste) containing 79.2% by weight of silver particles 1, 14.42% by weight of ODO, 3.61% by weight of DBDG, 2.76% by weight of IPTL-A and 0.01% by weight of DGA was obtained by the same method as that in Example 1, except that the amount of ODO added as the solvent 1 was 8.79 g, that the amount of DBDG added as the solvent 2 was 2.20 g, and that the amounts of ODO and DBDG added as the diluting solvents were 6.88 g and 1.72 g, respectively. Furthermore, the content of Ag in the silver paste was obtained by the heating loss method. As a result, the content of Ag was 78.3% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.8 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 4

A bonding material (silver paste) containing 81.0% by weight of silver particles 1, 12.85% by weight of ODO, 1.43% by weight of DBDG, 4.71% by weight of IPTL-A and 0.01% by weight of DGA was obtained by the same method as that in Example 1, except that the amount of ODO added as the solvent 1 was 8.09 g, that the amount of DBDG added as the solvent 2 was 0.90 g, that the amount of IPTL-A added as the addition agent was 5.0 g, and that the amounts of ODO and DBDG added as the diluting solvents were 5.56 g and 0.62 g, respectively. Furthermore, the content of Ag in the silver paste was obtained by the heating loss method. As a result, the content of Ag was 79.8% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.7 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 5

A bonding material (silver paste) containing 80.3% by weight of silver particles 1, 16.46% by weight of ODO, 1.83% by weight of DBDG, 1.40% by weight of IPTL-A and 0.01% by weight of DGA was obtained by the same method as that in Example 1, except that the amount of ODO added as the solvent 1 was 11.24 g, that the amount of DBDG added as the solvent 2 was 1.25 g, that the amount of IPTL-A added as the addition agent was 1.5 g, and that the amounts of ODO and DBDG added as the diluting solvents were 6.41 g and 0.71 g, respectively. Furthermore, the content of Ag in the silver paste was obtained by the heating loss method. As a result, the content of Ag was 79.1% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.4 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 6

A bonding material (silver paste) containing 80.7% by weight of silver particles 1, 14.83% by weight of ODO, 1.65% by weight of HeDG, 2.81% by weight of IPTL-A and 0.01% by weight of DGA was obtained by the same method as that in Example 1, except that 1.10 g of hexyl diglycol (HeDG) (produced by Nippon Nyukazai Co., Ltd., boiling point=260° C., viscosity (25° C.)=8.6 mPa·s, surface tension (25° C.)=32.3±3.0 dyne/cm (average value=32.3 dyne/cm)) was added in place of DBDG serving as the solvent 2 and that 5.93 g of ODO and 0.66 g of HeDG were added in place of ODO and DBDG serving as the diluting solvents. Furthermore, the content of Ag in the silver paste was obtained by the heating loss method. As a result, the content of Ag was 79.5% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.5 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 7

A bonding material (silver paste) containing 81.2% by weight of silver particles 1, 14.36% by weight of ODO, 1.60% by weight of 1-decanol, 2.83% by weight of IPTL-A and 0.01% by weight of DGA was obtained by the same method as that in Example 1, except that 1.10 g of 1-decanol (produced by Wako Pure Chemical Industries, Ltd., boiling point=227.8±3.0° C., viscosity (25° C.)=1.38 mPa·s, surface tension (25° C.)=29.9±3.0 dyne/cm (average value=29.9 dyne/cm)) was added in place of DBDG serving as the solvent 2 and that 5.33 g of ODO and 0.59 g of 1-decanol were added in place of ODO and DBDG serving as the diluting solvents. Furthermore, the content of Ag in the silver paste was obtained by the heating loss method. As a result, the content of Ag was 80.0% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.5 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 8

A bonding material (silver paste) containing 81.1% by weight of silver particles 1, 12.85% by weight of ODO, 3.21% by weight of 1-decanol, 2.83% by weight of IPTL-A and 0.01% by weight of DGA was obtained by the same method as that in Example 1, except that the amount of ODO added as the solvent 1 was 8.79 g (8.79% by weight), that 2.20 g of 1-decanol (produced by Wako Pure Chemical Industries, Ltd.) was added in place of DBDG serving as the solvent 2 and that 4.84 g of ODO and 1.21 g of 1-decanol were added in place of ODO and DBDG serving as the diluting solvents. Furthermore, the content of Ag in the silver paste was obtained by the heating loss method. As a result, the content of Ag was 79.9% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.6 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 9

First, 180.0 g of pure water was put in a 300 mL beaker, and 33.6 g of silver nitrate (produced by Toyo Kagaku Inc.)

was added thereto to be dissolved to prepare an aqueous silver nitrate solution as a raw material solution.

Then, 3322.0 g of pure water was put in a 5 L beaker, and the temperature thereof was raised to 60° C. while removing dissolved oxygen by blowing nitrogen gas into the pure water for 30 minutes. To this pure water, 44.8 g of sorbic acid (produced by Wako Pure Chemical Industries, Ltd.) was added as an organic compound (for coating of fine silver particles), and thereafter, 7.1 g of 28% ammonia water (produced by Wako Pure Chemical Industries, Ltd.) was added thereto as a stabilizing agent.

While the aqueous solution was stirred after the ammonia water was added, 14.9 g of hydrous hydrazine having a purity of 80% (produced by Otsuka Chemical Co., Ltd.) was added thereto as a reducing agent after 5 minutes from the addition of the ammonia water (reaction initiation), to prepare an aqueous reducing agent containing solution as a reducing solution. After 9 minutes from the reaction initiation, the raw material solution (aqueous silver nitrate solution), the temperature of which was adjusted to 60° C., was added to the reducing solution (aqueous reducing agent containing solution) at a stroke to be allowed to react with the reducing solution. After 25 minutes from the reaction initiation, the stirring was stopped.

After the aggregates of the fine silver particles (silver nanoparticles) coated with sorbic acid were thus formed, a liquid containing the aggregates of the fine silver particles was filtered by a No. 5C filter paper, and then, substances recovered by filtration were washed with pure water to obtain the aggregates of the fine silver particles. The aggregates of the fine silver particles were dried at 80° C. for 12 hours in a vacuum dryer to obtain a dried powder of the aggregates of the fine silver particles. The dried powder of the aggregates of the fine silver particles thus obtained was broken to adjust the size of the secondary aggregates. Furthermore, the average primary particle diameter of the fine silver particles was obtained by means of a scanning electron microscope (SEM). As a result, the average primary particle diameter was 60 nm.

Then, a bonding material (silver paste) containing 59.7% by weight of silver particles 1, 19.9% by weight of silver particles 2, 15.85% by weight of ODO, 1.76% by weight of DBDG, 2.78% by weight of IPTL-A and 0.01% by weight of DGA was obtained by the same method as that in Example 1, except that 21.5 g of the dried powder of the aggregates of the fine silver particles (silver particles 2) (coated with sorbic acid), the size of the secondary aggregates of which was thus adjusted, and 64.5 g of the dried powder of the aggregates of the fine silver particles (silver particles 1) (coated with sorbic acid), which was obtained by the same method as that in Example 1 and which had the average primary particle diameter of 85 nm, were used as the dried powder of the aggregates of the fine silver particles and that the amounts of ODO and DBDG added as the diluting solvents were 7.19 g and 0.80 g, respectively. Furthermore, the content of Ag in the silver paste was obtained by the heating loss method. As a result, the content of Ag was 78.2% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.7 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 10

A bonding material (silver paste) containing 58.5% by weight of silver particles 1, 19.5% by weight of silver particles 2, 17.34% by weight of ODO, 1.93% by weight of DBDG, 2.72% by weight of IPTL-A and 0.01% by weight of malonic acid was obtained by the same method as that in Example 9, except that 0.01 g of malonic acid was used in place of diglycolic acid serving as the sintering aid and that the amounts of ODO and DBDG added as the diluting solvents were 7.44 g and 0.83 g, respectively. Furthermore, the content of Ag in the silver paste was obtained by the heating loss method. As a result, the content of Ag was 78.0% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.8 when the viscosity was measured at 25 t.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 11

After the dried powder of the aggregates of fine silver particles (coated with sorbic acid) was obtained by the same method as that in Example 9, a bonding material (silver paste) containing 59.2% by weight of silver particles 2, 19.7% by weight of silver particles 3, 9.83% by weight of ODO, 9.83% by weight of DBDG and 1.44% by weight of IPTL-A was obtained by the same method as that in Example 1, except that 61.5 g of the dried powder of the aggregates of the fine silver particles (silver particles 2) and 20.5 g of micron-sized silver particles AG2-1C (produced by DOWA ELECTRONICS MATERIALS CO., LTD., average diameter (average primary particle diameter obtained from SEM image)=0.3 μm) (silver particles 3) were used in place of the dried powder of the aggregates of the fine silver particles (silver particles 1) in Example 1, that the amount of ODO added as the solvent 1 was 8.25 g, that the amount of DBDG added as the solvent 2 was 8.25 g, that the amount of IPTL-A added as the addition agent was 1.5 g, that the amounts of ODO and DBDG added as the diluting solvents were 1.98 g and 1.98 g, respectively and that diglycolic acid serving as the sintering aid was not added. Furthermore, the content of Ag in the silver paste was obtained by the heating loss method. As a result, the content of Ag was 78.2% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.9 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 12

A bonding material (silver paste) containing 59.4% by weight of silver particles 2, 19.8% by weight of silver particles 3, 11.61% by weight of ODO, 7.74% by weight of DBDG and 1.45% by weight of IPTL-A was obtained by the same method as that in Example 11, except that the amount of ODO added as the solvent 1 was 9.90 g, that the amount of DBDG added as the solvent 2 was 6.60 g and that the amounts of ODO and DBDG added as the diluting solvents were 2.14 g and 1.43 g, respectively. Furthermore, the content of Ag in the silver paste was obtained by the heating loss method. As a result, the content of Ag was 78.5% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.9 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 13

A bonding material (silver paste) containing 59.7% by weight of silver particles 2, 19.9% by weight of silver particles 3, 13.26% by weight of ODO, 5.68% by weight of DBDG and 1.46% by weight of IPTL-A was obtained by the same method as that in Example 11, except that the amount of ODO added as the solvent 1 was 11.55 g, that the amount of DBDG added as the solvent 2 was 4.95 g and that the amounts of ODO and DBDG added as the diluting solvents were 2.13 g and 0.91 g, respectively. Furthermore, the content of Ag in the silver paste was obtained by the heating loss method. As a result, the content of Ag was 78.9% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.9 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 14

A bonding material (silver paste) containing 60.0% by weight of silver particles 2, 20.0% by weight of silver particles 3, 14.83% by weight of ODO, 3.71% by weight of DBDG and 1.46% by weight of IPTL-A was obtained by the same method as that in Example 11, except that the amount of ODO added as the solvent 1 was 13.20 g, that the amount of DBDG added as the solvent 2 was 3.30 g and that the amounts of ODO and DBDG added as the diluting solvents were 2.02 g and 0.50 g, respectively. Furthermore, the content of Ag in the silver paste was obtained by the heating loss method. As a result, the content of Ag was 79.3% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.9 when the viscosity was measured at 25 t.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 15

A bonding material (silver paste) containing 60.3% by weight of silver particles 2, 20.1% by weight of silver particles 3, 16.32% by weight of ODO, 1.81% by weight of DBDG and 1.47% by weight of IPTL-A was obtained by the same method as that in Example 11, except that the amount of ODO added as the solvent 1 was 14.85 g, that the amount of DBDG added as the solvent 2 was 1.65 g and that the amounts of ODO and DBDG added as the diluting solvents were 1.81 g and 0.20 g, respectively. Furthermore, the content of Ag in the silver paste was obtained by the heating loss method. As a result, the content of Ag was 79.7% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.9 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 16

A bonding material (silver paste) containing 58.9% by weight of silver particles 2, 19.6% by weight of silver particles 3, 10.03% by weight of ODO, 10.03% by weight of 1-decanol and 1.44% by weight of IPTL-A was obtained by the same method as that in Example 11, except that 8.25 g of 1-decanol (produced by Wako Pure Chemical Industries, Ltd.) was added in place of DBDG serving as the solvent 2 and that 2.19 g of ODO and 2.19 g of 1-decanol were added in place of ODO and DBDG serving as the diluting solvents. Furthermore, the content of Ag in the silver paste was obtained by the heating loss method. As a result, the content of Ag was 78.0% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.3 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 17

A bonding material (silver paste) containing 59.2% by weight of silver particles 2, 19.7% by weight of silver particles 3, 11.79% by weight of ODO, 7.86% by weight of 1-decanol and 1.45% by weight of IPTL-A was obtained by the same method as that in Example 12, except that 6.60 g of 1-decanol (produced by Wako Pure Chemical Industries, Ltd.) was added in place of DBDG serving as the solvent 2 and that 2.30 g of ODO and 1.54 g of 1-decanol were added in place of ODO and DBDG serving as the diluting solvents.

Furthermore, the content of Ag in the silver paste was obtained by the heating loss method. As a result, the content of Ag was 78.4% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.3 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 18

A bonding material (silver paste) containing 59.5% by weight of silver particles 2, 19.8% by weight of silver particles 3, 13.47% by weight of ODO, 5.77% by weight of 1-decanol and 1.46% by weight of IPTL-A was obtained by the same method as that in Example 13, except that 4.95 g of 1-decanol (produced by Wako Pure Chemical Industries, Ltd.) was added in place of DBDG serving as the solvent 2 and that 2.32 g of ODO and 0.99 g of 1-decanol were added in place of ODO and DBDG serving as the diluting solvents. Furthermore, the content of Ag in the silver paste was obtained by the heating loss method. As a result, the content of Ag was 78.8% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.2 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 19

A bonding material (silver paste) containing 59.8% by weight of silver particles 2, 19.9% by weight of silver particles 3, 15.07% by weight of ODO, 3.77% by weight of 1-decanol and 1.46% by weight of IPTL-A was obtained by the same method as that in Example 14, except that 3.30 g of 1-decanol (produced by Wako Pure Chemical Industries, Ltd.) was added in place of DBDG serving as the solvent 2 and that 2.23 g of ODO and 0.56 g of 1-decanol were added in place of ODO and DBDG serving as the diluting solvents.

Furthermore, the content of Ag in the silver paste was obtained by the heating loss method. As a result, the content of Ag was 79.2% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.2 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 20

A bonding material (silver paste) containing 60.1% by weight of silver particles 2, 20.0% by weight of silver particles 3, 16.59% by weight of ODO, 1.84% by weight of 1-decanol and 1.47% by weight of IPTL-A was obtained by the same method as that in Example 15, except that 1.65 g of 1-decanol (produced by Wako Pure Chemical Industries, Ltd.) was added in place of DBDG serving as the solvent 2 and that 2.05 g of ODO and 0.23 g of 1-decanol were added in place of ODO and DBDG serving as the diluting solvents. Furthermore, the content of Ag in the silver paste was obtained by the heating loss method. As a result, the content of Ag was 79.6% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.1 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 21

A bonding material (silver paste) containing 59.1% by weight of silver particles 2, 19.7% by weight of silver particles 3, 9.88% by weight of ODO, 9.88% by weight of HeDG and 1.44% by weight of IPTL-A was obtained by the same method as that in Example 11, except that 8.25 g of hexyl diglycol (HeDG) (produced by Nippon Nyukazai Co., Ltd.) was added in place of DBDG serving as the solvent 2 and that 1.99 g of ODO and 1.99 g of HeDG were added in place of ODO and DBDG serving as the diluting solvents.

Furthermore, the content of Ag in the silver paste was obtained by the heating loss method. As a result, the content of Ag was 78.2% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.1 when the viscosity was measured at 25 t.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 22

A bonding material (silver paste) containing 59.5% by weight of silver particles 2, 19.8% by weight of silver particles 3, 8.90% by weight of ODO, 8.90% by weight of DBDG and 2.90% by weight of IPTL-A was obtained by the same method as that in Example 11, except that the amount of ODO added as the solvent 1 was 7.50 g, that the amount of DBDG added as the solvent 2 was 7.50 g, that the amount of IPTL-A added as the addition agent was 3.0 g and that the amounts of ODO and DBDG added as the diluting solvents were 1.65 g and 1.65 g, respectively. Furthermore, the content of Ag in the silver paste was obtained by the heating loss method. As a result, the content of Ag was 78.3% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.1 when the viscosity was measured at 25 t.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 23

A bonding material (silver paste) containing 59.2% by weight of silver particles 2, 19.7% by weight of silver particles 3, 9.59% by weight of ODO, 9.59% by weight of DBDG and 1.92% by weight of IPTL-A was obtained by the same method as that in Example 11, except that the amount of ODO added as the solvent 1 was 8.00 g, that the amount of DBDG added as the solvent 2 was 8.00 g, that the amount of IPTL-A added as the addition agent was 2.0 g and that the amounts of ODO and DBDG added as the diluting solvents were 1.92 g and 1.92 g, respectively. Furthermore, the content of Ag in the silver paste was obtained by the heating loss method. As a result, the content of Ag was 78.0% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.2 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 24

After the dried powder of the aggregates of fine silver particles (coated with sorbic acid) was obtained by the same method as that in Example 9, a bonding material (silver paste) containing 68.3% by weight of silver particles 2, 9.5% by weight of silver particles 3, 10.40% by weight of ODO, 10.40% by weight of DBDG and 1.40% by weight of IPTL-A was obtained by the same method as that in Example 1, except that 72.0 g of the dried powder of the aggregates of the fine silver particles (silver particles 2) and 10.0 g of micron-sized silver particles AG2-1C (produced by DOWA ELECTRONICS MATERIALS CO., LTD., average diameter=0.3 µm) (silver particles 3) were used in place of the dried powder of the aggregates of the fine silver particles (silver particles 1) in Example 1, that the amount of ODO added as the solvent 1 was 8.25 g, that the amount of DBDG added as the solvent 2 was 8.25 g, that the amount of IPTL-A added as the addition agent was 1.5 g, that the amounts of ODO and DBDG added as the diluting solvents were 2.75 g and 2.75 g, respectively and that diglycolic acid serving as the sintering aid was not added. Furthermore, the content of Ag in the silver paste was obtained by the heating loss method. As a result, the content of Ag was 76.5% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.4 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Example 25

A bonding material (silver paste) containing 83.4% by weight of silver particles 1, 12.34% by weight of ODO, 1.37% by weight of DBDG, 2.92% by weight of IPTL-B and 0.01% by weight of DGA was obtained by the same method as that in Example 1, except that 3.00 g of 2-methyl-butane-1,3,4-triol (isoprene triol B (IPTL-B)) (boiling point=278 to 282° C., viscosity (25° C.)=4050 mPa·s, surface tension (25° C.)=47.5±1.0 dyne/cm (average value=47.5 dyne/cm)) was added in place of IPTL-A serving as the addition agent and that the amounts of ODO and DBDG added as the diluting solvents were 2.84 g and 0.32 g, respectively. Furthermore, the content of Ag in the silver paste was obtained by the heating loss method. As a result, the content of Ag was 82.8% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.4 when the viscosity was measured at 25° C.

The bonding material was used for preparing a coating film, a pre-dried film and a bonded product to observe them by the same methods as those in Example 1. As a result, no bubbles were observed in the coating film. In addition, no cracks were observed in the pre-dried film, and the separation of the pre-dried film was not observed. Moreover, no voids were observed in the silver bonding layer of the bonded product.

Comparative Example 1

A bonding material (silver paste) containing 81.4% by weight of silver particles 1, 15.80% by weight of ODO, 2.79% by weight of IPTL-A and 0.01% by weight of DGA was obtained by the same method as that in Example 1, except that the amount of ODO added as the solvent 1 was 17.49 g, that DBDG serving as the solvent 2 was not added, and that 5.67 g of ODO was added in place of ODO and DBDG serving as the diluting solvents. Furthermore, the content of Ag in the silver paste was obtained by the heating loss method. As a result, the content of Ag was 79.9% by weight.

The particle size of silver particles contained in this bonding material (silver paste) was evaluated by the same method as that in Example 1. As a result, the first scratch was less than 20 µm, the fourth scratch was less than 10 µm, and the average particle diameter $D_{50}$ was less than 5 µm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 3.3 when the viscosity was measured at 25° C.

The bonding material was used for preparing a coating film, a pre-dried film and a bonded product to observe them by the same methods as those in Example 1. As a result, bubbles were formed in the coating film. Although cracks were formed in the pre-dried film, the separation of the pre-dried film was not observed. Moreover, voids caused by the cracks in the pre-dried film were observed in the silver bonding layer of the bonded product.

Comparative Example 2

A bonding material (silver paste) containing 78.6% by weight of silver particles 1, 16.55% by weight of ODO, 1.84% by weight of DBDG, 2.74% by weight of IPDL-EtHex and 0.01% by weight of DGA was obtained by the same method as that in Example 1, except that 3.0 g of a diol (IPDL-EtHex) (produced by Nippon Terpene Chemicals, Inc., boiling point=287.8° C., viscosity (25° C.)=90.2 mPa·s, surface tension (25° C.)=30.3 dyne/cm) was added in place of IPTL-A serving as the addition agent and that the amounts of ODO and DBDG added as the diluting solvents were 8.36 g and 0.93 g, respectively. Furthermore, the content of Ag in the silver paste was obtained by the heating loss method. As a result, the content of Ag was 77.5% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.5 when the viscosity was measured at 25° C.

The bonding material was used for preparing a coating film, a pre-dried film and a bonded product to observe them by the same methods as those in Example 1. As a result, bubbles were formed in the coating film. Although cracks were formed in the pre-dried film, the separation of the pre-dried film was not observed. Moreover, voids caused by the cracks in the pre-dried film were observed in the silver bonding layer of the bonded product.

Comparative Example 3

A bonding material (silver paste) containing 78.9% by weight of silver particles 1, 16.28% by weight of ODO, 1.81% by weight of DBDG, 2.75% by weight of IPDL-C8 and 0.01% by weight of DGA was obtained by the same method as that in Example 1, except that 3.0 g of a diol (IPDL-C8) (produced by Nippon Terpene Chemicals, Inc., boiling point=308.1° C., viscosity (25° C.)=65 mPa·s, surface tension (25° C.)=30.86 dyne/cm) was added in place of IPTL-A serving as the addition agent and that the amounts of ODO and DBDG added as the diluting solvents were 8.13 g and 0.90 g, respectively. Furthermore, the content of Ag in the silver paste was obtained by the heating loss method. As a result, the content of Ag was 77.5% by weight.

The particle size of silver particles contained in this bonding material (silver paste) was evaluated by the same method as that in Example 1. As a result, the first scratch was less than 20 μm, the fourth scratch was less than 10 μm, and the average particle diameter $D_{50}$ was less than 5 μm. The viscosity and Ti value of the bonding material (silver paste) were obtained by the same methods as those in Example 1. As a result, the viscosity measured at 25° C. was 15 (Pa·s) at 5 rpm (15.7 [1/s]), and the Ti value was 4.5 when the viscosity was measured at 25° C.

The bonding material was used for preparing a coating film, a pre-dried film and a bonded product to observe them by the same methods as those in Example 1. As a result, bubbles were formed in the coating film. In addition, cracks were formed in the pre-dried film, and the separation of the pre-dried film was caused. Moreover, voids caused by the cracks in the pre-dried film were observed in the silver bonding layer of the bonded product.

Comparative Example 4

It was attempted to produce a bonding material (silver paste) by the same method as that in Example 1, except that 1.10 g of hexadecane (produced by Wako Pure Chemical Industries, Ltd., boiling point=286.6±3.0° C., viscosity (25° C.)=3 mPa·s, surface tension (25° C.)=27.3±3.0 dyne/cm (average value=27.3 dyne/cm), nonpolar) was added in place of DBDG serving as the solvent 2 and that ODO and DBDG serving as the diluting solvents were not added. However, separation was caused before adding ODO and Hexadecane serving as the diluting solvents, so that it was not possible to produce any silver paste due to the dispersion failure of the components thereof.

The producing conditions and characteristics of the bonding materials produced in these examples and comparative examples are shown in Tables 1-2.

TABLE 1

| | Content in Silver Paste (% by weight) | | | | | | |
|---|---|---|---|---|---|---|---|
| | Silver Particles | | | Solvent | | Addition | Sintering |
| | 1 | 2 | 3 | 1 | 2 | Agent | Aid |
| Ex. 1 | 80.8 | — | — | 14.73 | DBDG 1.64 | IPTL-A 2.82 | DGA 0.01 |
| Ex. 2 | 79.5 | — | — | 15.06 | DBDG 2.66 | IPTL-A 2.77 | DGA 0.01 |
| Ex. 3 | 79.2 | — | — | 14.42 | DBDG 3.61 | IPTL-A 2.76 | DGA 0.01 |
| Ex. 4 | 81.0 | — | — | 12.85 | DBDG 1.43 | IPTL-A 4.71 | DGA 0.01 |
| Ex. 5 | 80.3 | — | — | 16.46 | DBDG 1.83 | IPTL-A 1.40 | DGA 0.01 |
| Ex. 6 | 80.7 | — | — | 14.83 | HeDG 1.65 | IPTL-A 2.81 | DGA 0.01 |
| Ex. 7 | 81.2 | — | — | 14.36 | decanol 1.60 | IPTL-A 2.83 | DGA 0.01 |
| Ex. 8 | 81.1 | — | — | 12.85 | decanol 3.21 | IPTL-A 2.83 | DGA 0.01 |
| Ex. 9 | 59.7 | 19.9 | — | 15.85 | DBDG 1.76 | IPTL-A 2.78 | DGA 0.01 |
| Ex. 10 | 58.5 | 19.5 | — | 17.34 | DBDG 1.93 | IPTL-A 2.72 | malonic acid 0.01 |
| Ex. 11 | — | 59.2 | 19.7 | 9.83 | DBDG 9.83 | IPTL-A 1.44 | — |
| Ex. 12 | — | 59.4 | 19.8 | 11.61 | DBDG 7.74 | IPTL-A 1.45 | — |
| Ex. 13 | — | 59.7 | 19.9 | 13.26 | DBDG 5.68 | IPTL-A 1.46 | — |
| Ex. 14 | — | 60.0 | 20.0 | 14.83 | DBDG 3.71 | IPTL-A 1.46 | — |
| Ex. 15 | — | 60.3 | 20.1 | 16.32 | DBDG 1.81 | IPTL-A 1.47 | — |
| Ex. 16 | — | 58.9 | 19.6 | 10.03 | decanol 10.03 | IPTL-A 1.44 | — |
| Ex. 17 | — | 59.2 | 19.7 | 11.79 | decanol 7.86 | IPTL-A 1.45 | — |
| Ex. 18 | — | 59.5 | 19.8 | 13.47 | decanol 5.77 | IPTL-A 1.46 | — |

TABLE 1-continued

| | Content in Silver Paste (% by weight) | | | | | | |
|---|---|---|---|---|---|---|---|
| | Silver Particles | | | Solvent | | Addition Agent | Sintering Aid |
| | 1 | 2 | 3 | 1 | 2 | | |
| Ex. 19 | — | 59.8 | 19.9 | 15.07 | decanol 3.77 | IPTL-A 1.46 | — |
| Ex. 20 | — | 60.1 | 20.0 | 16.59 | decanol 1.84 | IPTL-A 1.47 | — |
| Ex. 21 | — | 59.1 | 19.7 | 9.88 | HeDG 9.88 | IPTL-A 1.44 | — |
| Ex. 22 | — | 59.5 | 19.8 | 8.90 | DBDG 8.90 | IPTL-A 2.90 | — |
| Ex. 23 | — | 59.2 | 19.7 | 9.59 | DBDG 9.59 | IPTL-A 1.92 | — |
| Ex. 24 | — | 68.3 | 9.5 | 10.40 | DBDG 10.40 | IPTL-A 1.40 | — |
| Ex. 25 | 83.4 | — | — | 12.34 | DBDG 1.37 | IPTL-B 2.92 | DGA 0.01 |
| Comp. 1 | 81.4 | — | — | 15.80 | — | IPTL-A 2.79 | DGA 0.01 |
| Comp. 2 | 78.6 | — | — | 16.55 | DBDG 1.84 | IPDL-EtHex 2.74 | DGA 0.01 |
| Comp. 3 | 78.9 | — | — | 16.28 | DBDG 1.81 | IPDL-C8 2.75 | DGA 0.01 |
| Comp. 4 | 86.0 | — | — | 9.89 | Hexadecane 1.10 | IPTL-A 3.00 | DGA 0.01 |

TABLE 2

| | Content of Ag (wt %) | Particle Size (μm) | | | Viscosity | |
|---|---|---|---|---|---|---|
| | | 1st | 4th | D$_{50}$ | (Pa·s) | Ti |
| Ex. 1 | 79.6 | <20 | <10 | <5 | 15 | 3.6 |
| Ex. 2 | 78.5 | <20 | <10 | <5 | 15 | 3.7 |
| Ex. 3 | 78.3 | <20 | <10 | <5 | 15 | 3.8 |
| Ex. 4 | 79.8 | <20 | <10 | <5 | 15 | 3.7 |
| Ex. 5 | 79.1 | <20 | <10 | <5 | 15 | 3.4 |
| Ex. 6 | 79.5 | <20 | <10 | <5 | 15 | 3.5 |
| Ex. 7 | 80.0 | <20 | <10 | <5 | 15 | 3.5 |
| Ex. 8 | 79.9 | <20 | <10 | <5 | 15 | 3.6 |
| Ex. 9 | 78.2 | <20 | <10 | <5 | 15 | 3.7 |
| Ex. 10 | 78.0 | <20 | <10 | <5 | 15 | 3.8 |
| Ex. 11 | 78.2 | <20 | <10 | <5 | 15 | 3.9 |
| Ex. 12 | 78.5 | <20 | <10 | <5 | 15 | 3.9 |
| Ex. 13 | 78.9 | <20 | <10 | <5 | 15 | 3.9 |
| Ex. 14 | 79.3 | <20 | <10 | <5 | 15 | 3.9 |
| Ex. 15 | 79.7 | <20 | <10 | <5 | 15 | 3.9 |
| Ex. 16 | 78.0 | <20 | <10 | <5 | 15 | 4.3 |
| Ex. 17 | 78.4 | <20 | <10 | <5 | 15 | 4.3 |
| Ex. 18 | 78.8 | <20 | <10 | <5 | 15 | 4.2 |
| Ex. 19 | 79.2 | <20 | <10 | <5 | 15 | 4.2 |
| Ex. 20 | 79.6 | <20 | <10 | <5 | 15 | 4.1 |
| Ex. 21 | 78.2 | <20 | <10 | <5 | 15 | 4.1 |
| Ex. 22 | 78.3 | <20 | <10 | <5 | 15 | 4.1 |
| Ex. 23 | 78.0 | <20 | <10 | <5 | 15 | 4.2 |
| Ex. 24 | 76.5 | <20 | <10 | <5 | 15 | 4.4 |
| Ex. 25 | 82.8 | <20 | <10 | <5 | 15 | 3.4 |
| Comp. 1 | 79.9 | <20 | <10 | <5 | 15 | 3.3 |
| Comp. 2 | 77.5 | <20 | <10 | <5 | 15 | 4.5 |
| Comp. 3 | 77.5 | <20 | <10 | <5 | 15 | 4.5 |
| Comp. 4 | — | — | — | — | — | — |

The invention claimed is:

1. A bonding material of a silver paste consisting of:
fine silver particles, each of which is coated with an organic compound;
a solvent consisting of a first solvent of a diol, and a second solvent which is a polar solvent having a lower surface tension than that of the first solvent and which is a glycol ether or mono-alcohol having a carbon number of 8 to 12;
an addition agent which is a triol; and
a sintering aid,
wherein the content of the second solvent in the bonding material is in the range of from 0.5% by weight to 15% by weight, and
wherein the content of the addition agent in the bonding material is in the range of from 0.5% by weight to 10% by weight.

2. A bonding material as set forth in claim 1, wherein said first solvent is octanediol.

3. A bonding material as set forth in claim 1, wherein said second solvent is one or more selected from the group consisting of dibutyl diglycol, hexyl diglycol and decanol.

4. A bonding material as set forth in claim 1, wherein said fine silver particles have an average primary particle diameter of 1 to 100 nm.

5. A bonding material as set forth in claim 1, wherein the content of the fine silver particles in said bonding material is in the range of from 60% by weight to 90% by weight.

6. A bonding material as set forth in claim 1, wherein said organic compound has a carbon number of not greater than 8.

7. A bonding material as set forth in claim 6, wherein said organic compound is sorbic acid.

8. A bonding material as set forth in claim 1, wherein the content of said first solvent in said bonding material is in the range of from 5% by weight to 20% by weight.

9. A bonding material as set forth in claim 1, wherein said sintering aid is diglycolic acid or malonic acid.

10. A bonding material as set forth in claim 1, wherein the content of said sintering aid in said bonding material is in the range of from 0.001% by weight to 0.1% by weight.

11. A bonding material as of a silver paste consisting of:
fine silver particles, each of which is coated with an organic compound;
silver particles having an average particle diameter of 0.2 to 10 μm;
a solvent consisting of a first solvent of a diol, and a second solvent which is a polar solvent having a lower surface tension than that of the first solvent and which is a glycol ether or mono-alcohol having a carbon number of 8 to 12; and
an addition agent which is a triol,
wherein the content of the second solvent in the bonding material is in the range of from 0.5% by weight to 15% by weight, and
wherein the content of the addition agent in the bonding material is in the range of from 0.5% by weight to 10% by weight.

12. A bonding material as set forth in claim 11, wherein the content of said silver particles having the average particle diameter of 0.2 to 10 μm in said bonding material is not greater than 30% by weight and wherein the total of the content of said fine silver particles and the content of said silver particles having the average particle diameter of 0.2 to 10 μm is in the range of from 60% by weight to 90% by weight.

13. A bonding material as set forth in claim 11, wherein said first solvent is octanediol.

14. A bonding material as set forth in claim 11, wherein said second solvent is one or more selected from the group consisting of dibutyl diglycol, hexyl diglycol and decanol.

15. A bonding material as set forth in claim 11, wherein said fine silver particles have an average primary particle diameter of 1 to 100 nm.

16. A bonding material as set forth in claim 11, wherein the content of the fine silver particles in said bonding material is in the range of from 60% by weight to 90% by weight.

17. A bonding material as set forth in claim 11, wherein said organic compound has a carbon number of not greater than 8.

18. A bonding material as set forth in claim 17, wherein said organic compound is sorbic acid.

19. A bonding material as set forth in claim 11, wherein the content of said first solvent in said bonding material is in the range of from 5% by weight to 20% by weight.

20. A bonding method comprising the steps of:
  arranging a bonding material, as set forth in claim 1, between articles; and
  heating the bonding material to sinter silver therein to form a silver bonding layer to bond the articles to each other with the silver bonding layer.

* * * * *